United States Patent
Bhaskaran et al.

(10) Patent No.: US 8,222,796 B2
(45) Date of Patent: Jul. 17, 2012

(54) MICRO-ELECTRO-MECHANICAL DEVICE WITH A PIEZOELECTRIC ACTUATOR

(75) Inventors: Harish Bhaskaran, Thalwil (CH); Michel Despont, Au (CH)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 12/578,619

(22) Filed: Oct. 14, 2009

(65) Prior Publication Data

US 2010/0090565 A1    Apr. 15, 2010

(30) Foreign Application Priority Data

Oct. 15, 2008  (EP) .................................. 08105585

(51) Int. Cl.
*H01L 41/00* (2006.01)
(52) U.S. Cl. ......... 310/330; 310/321; 310/331; 310/332
(58) Field of Classification Search .................. 310/330, 310/331, 332, 321, 328
See application file for complete search history.

(56) References Cited

U.S. PATENT DOCUMENTS

| | | | | |
|---|---|---|---|---|
| 4,553,061 A * | 11/1985 | Germano | ....................... | 310/332 |
| 5,742,377 A | 4/1998 | Minne et al. | | |
| 6,479,920 B1 * | 11/2002 | Lal et al. | ....................... | 310/309 |
| 6,700,309 B2 * | 3/2004 | Dausch et al. | ................. | 310/330 |
| 7,109,641 B2 * | 9/2006 | Park | ............................... | 310/330 |
| 7,242,825 B2 | 7/2007 | Lin et al. | | |
| 7,372,191 B2 * | 5/2008 | Ohmori et al. | ................ | 310/330 |
| 2003/0012545 A1 | 1/2003 | Bellman et al. | | |
| 2004/0129953 A1 * | 7/2004 | Tamura et al. | ................ | 257/202 |
| 2005/0168306 A1 * | 8/2005 | Cohn et al. | ..................... | 335/78 |
| 2007/0159510 A1 * | 7/2007 | Hong et al. | ...................... | 347/54 |

* cited by examiner

*Primary Examiner* — Walter Benson
*Assistant Examiner* — Bryan Gordon
(74) *Attorney, Agent, or Firm* — Vazken Alexanian

(57) ABSTRACT

A micro-electro-mechanical device including a substrate with a main surface, a piezoelectric actuator with a first side mechanically coupled to the substrate, an elastic member with a first end mechanically coupled to the substrate, and a transfer member mechanically coupling a second side of the piezoelectric actuator to the elastic member. The piezoelectric actuator is positioned lateral to an unfixed region of the elastic member. The method includes applying a voltage to a piezoelectric actuator altering the piezoelectric actuator's dimension vertical to the main surface of the substrate; and mechanically transferring the alteration to a coupling point of an elastic member.

19 Claims, 5 Drawing Sheets ized by utilizing the $d_{31}$-
MICRO-ELECTRO-MECHANICAL DEVICE WITH A PIEZOELECTRIC ACTUATOR This application claims priority under 35 U.S.C. 119 from European Patent Application 08105585.7, filed Oct. 15, 2008, the entire contents of which are incorporated herein by reference.

BACKGROUND OF THE INVENTION

1. Field of the Invention

The present invention relates to a micro-electro-mechanical device and method including a piezoelectric actuator. More particularly, the present invention relates to a device and method of translating piezoelectric action to another member of the device.

2. Description of Related Art

Micro-electro-mechanical systems (MEMS) using piezoelectric actuation are typically actuated by utilcoefficient of a piezoelectric layer deposited on a cantilever. By means of electrodes parallel to both a cantilever and a piezoelectric layer, an electrostatic field vertical to the cantilever is applied to the piezoelectric layer. This vertical electrostatic field causes an expansion or a contraction of the piezoelectric layer in the transverse, or horizontal, direction. This causes the cantilever to bend. The bending causes an unanchored end of the cantilever to be vertically translated. An example of the this type of a device is shown in U.S. Pat. No. 5,742,377.

Unfortunately, the $d_{31}$-coefficient utilized in the above-described conventional micro-electro-mechanical systems is typically comparatively small. For typical materials the $d_{33}$-coefficient is 2 to 5 times greater than the $d_{31}$-coefficient. U.S. Patent Publication No. 2003/0012545 A1 describes a broadband variable optic attenuator wherein a cantilever is deflected by means of a piezoelectric actuator arranged between a substrate and the cantilever.

For a number of technological reasons, this arrangement is not appropriate for many micro-electro-mechanical devices.

SUMMARY OF THE INVENTION

In one aspect, the present invention provides a micro-electro-mechanical device, including: a substrate with a main surface; an elastic member with a first end mechanically coupled to the substrate; a piezoelectric actuator with a first side mechanically coupled to the substrate, said piezoelectric actuator being positioned lateral to an unfixed region of the elastic member; and a transfer member mechanically coupling a second side of the piezoelectric actuator to the elastic member.

In another aspect, the present invention provides a method of translating piezoelectric action vertical to a main surface of a substrate to a member's motion vertical to the main surface of the substrate. The method includes: applying a voltage to a piezoelectric actuator thereby altering the piezoelectric actuator's dimension vertical to the main surface of the substrate; and mechanically transferring the alteration of the vertical dimension of the piezoelectric actuator to a coupling point of an elastic member.

BRIEF DESCRIPTION OF THE DRAWINGS

Embodiments of the present invention are described with reference to the figures in which.

DETAILED DESCRIPTION OF PREFERRED EMBODIMENTS

Figure 1:
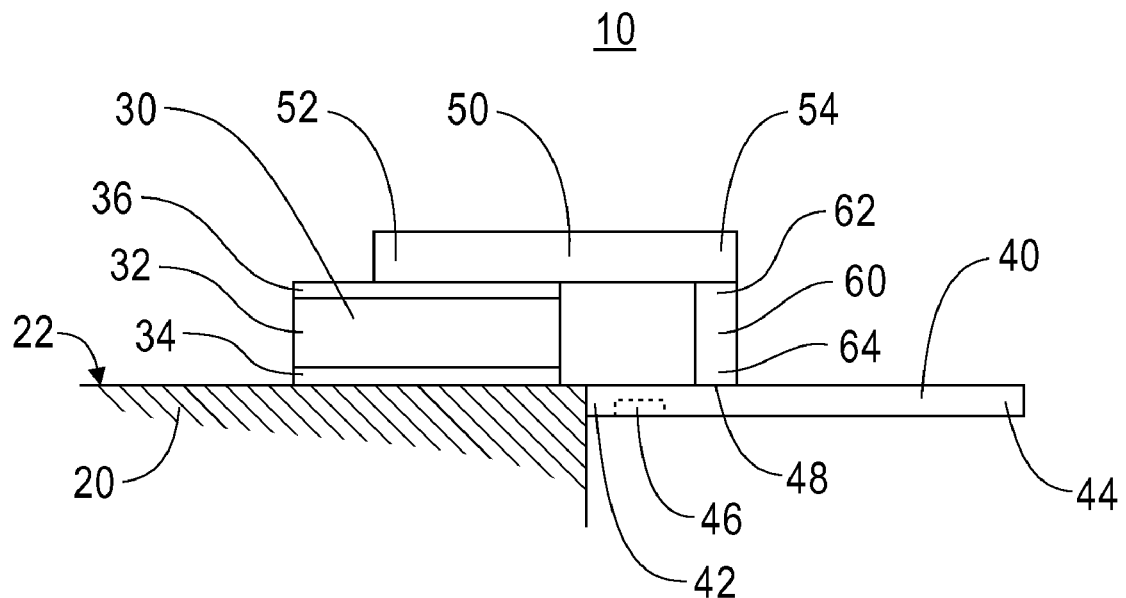
FIG. 1 is a schematic representation of a micro-electro-mechanical device.

Some embodiments of the present invention are based on the idea of arranging a piezoelectric actuator lateral to an unanchored region of an elastic member and to mechanically couple the piezoelectric actuator and the unanchored region of the elastic member by a transfer member. For many applications, this arrangement provides a number of advantages. The transfer member can be positioned above the piezoelectric actuator and the elastic member, i.e., on sides of the piezoelectric actuator and the elastic member which are averted from the substrate.

Furthermore, the actuation layer, or piezoelectric layer, is decoupled from the elastic element in so far as there is no direct interface between the piezoelectric actuator and no mechanical stress is directly transferred between the piezoelectric actuator and the elastic element. For some applications, this can increase reliability and lifetime of the micro-electro-mechanical device considerably.

Furthermore, for many applications, a mechanical amplification or attenuation can be set by means of the shapes and the dimensions of the elastic member and the transfer member. Furthermore, depending on the application, the dimensions and shapes of the transfer member and the elastic member, a lower power budget can be required for some applications.

Furthermore, the arrangement of the piezoelectric actuator and the unanchored region of the elastic member lateral to each other allow, for many applications, for the actuator geometry to be independent of the elastic member.

A micro-electro-mechanical device includes a substrate with a main surface and a piezoelectric actuator with a first side mechanically coupled to the substrate. A first end of an elastic member is mechanically coupled to the substrate. A transfer member mechanically couples a second side of the piezoelectric actuator to the elastic member. The piezoelectric actuator is, with respect to the main surface, arranged lateral to an unanchored region of the elastic member, on the substrate.

In order to translate piezoelectric action vertical to a main surface of a substrate to a member's motion vertical to the main surface of the substrate, a voltage is applied to a piezoelectric actuator thereby altering the piezoelectric actuator's dimension vertical to the main surface of the substrate. The alteration of the vertical dimension of the piezoelectric actuator is mechanically transferred to an elastic member arranged lateral to the piezoelectric actuator, thereby distorting the elastic member in a direction vertical to the main surface of the substrate.

In one method of fabricating a micro-electro-mechanical device, an elastic member is provided with a first end mechanically coupled to a substrate. A piezoelectric actuator is provided at the substrate lateral to the elastic member. A first side of the piezoelectric actuator is mechanically coupled to the substrate. A second side of the piezoelectric actuator is mechanically coupled to the elastic member by means of a transfer member.

The elastic member can be a beam cantilevered or otherwise secured at one or both ends, anchored, anchored or hinged. The elastic member can be elastic in a direction vertical to the main surface of the substrate. The transfer member can be mechanically coupled to a first side of the elastic member, wherein the first side of the elastic member is averted from the substrate. The transfer member can be coupled to a coupling point of the elastic member, wherein the coupling point is remote from the first end of the elastic member. The elastic member can include a notch or a groove or a recess near its first end. Thereby, the elasticity of the elastic member can be increased locally, forming a hinge near the first end of the elastic member.

The transfer member can include a bar and a stud. The bar is arranged essentially parallel to the main surface of the substrate, and the stud is arranged essentially vertical to the main surface of the substrate. A first end of the bar is attached to the free second side of the piezoelectric actuator. A second end of the bar is attached to a first end of the stud. A second end of the stud is attached to the elastic member.

A piezoelectric actuator being arranged lateral to an unanchored region of an elastic member is, for example, a piezoelectric actuator without overlap or essentially without overlap, in a projection vertical to a main surface of a substrate, with the unanchored region of the elastic member.

The micro-electro-mechanical devices described above can include at least one of an electric switch, a fluid valve, an optic switch or a variable optic attenuator. In these cases, a first contact of the electric switch or a valve member or an end of a wave or light guide, respectively, is mechanically coupled to the elastic member. As a further alternative, the micro-electro-mechanical device can include or be part of a probe-based technology such as data storage, nanolithography or nanometrology.

Figure 7:
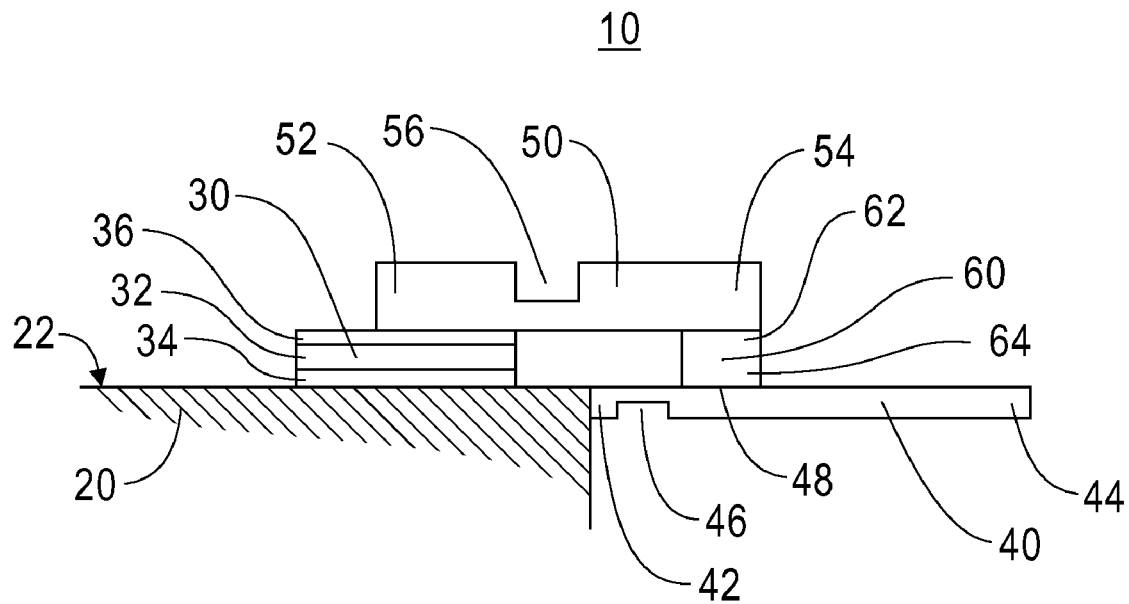
FIG. 7 is a schematic representation of another micro-electro-mechanical device.
Figure 8:
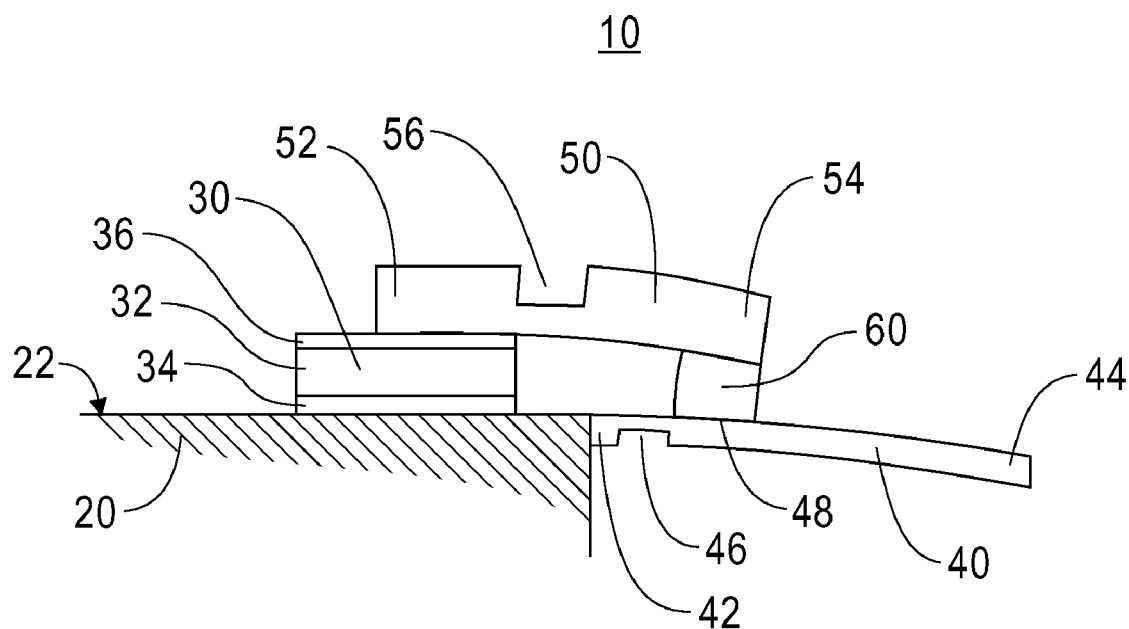
FIG. 8 is a schematic representation of the micro-electro-mechanical device of FIG. 7 in a distorted state.
Figure 9:
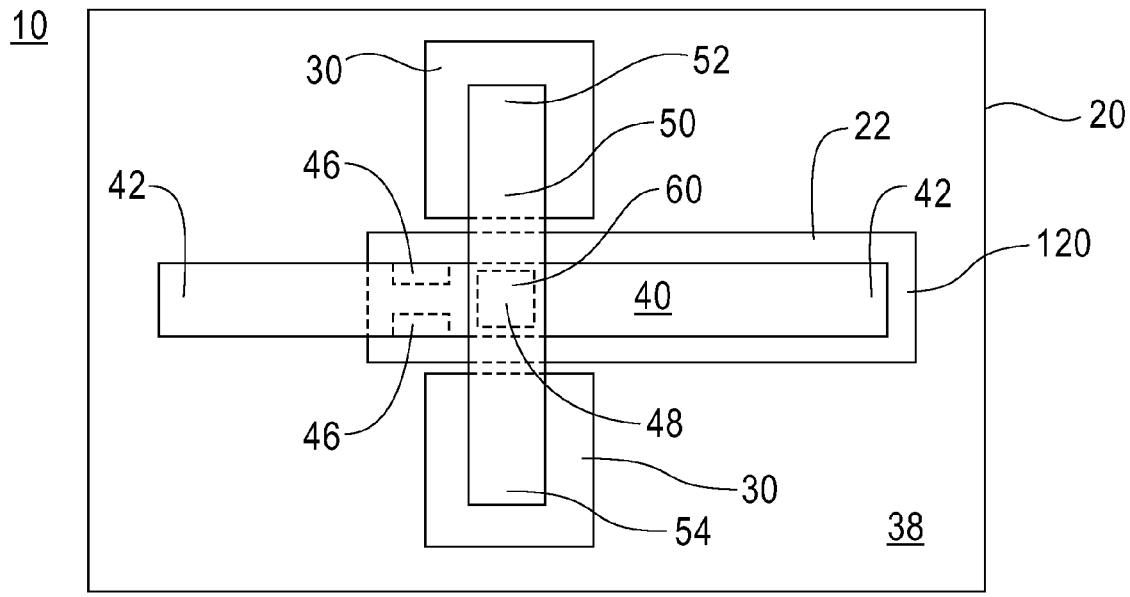
FIG. 9 is a schematic representation of another micro-electro-mechanical device.

Each of the FIGS. 1 through 9 displays a schematic representation of a micro-electro-mechanical device 10. Each of the FIGS. 1 through 8 displays a schematic representation of a vertical cross section of the respective micro-electro-mechanical device 10, i.e., the section displayed is vertical to a substrate's 20 main surface 22. FIG. 9 displays a top view of the respective micro-electro-mechanical device 10, i.e., the direction of the displayed view is vertical to the main surface 22 of the substrate 20.

Figure 2:
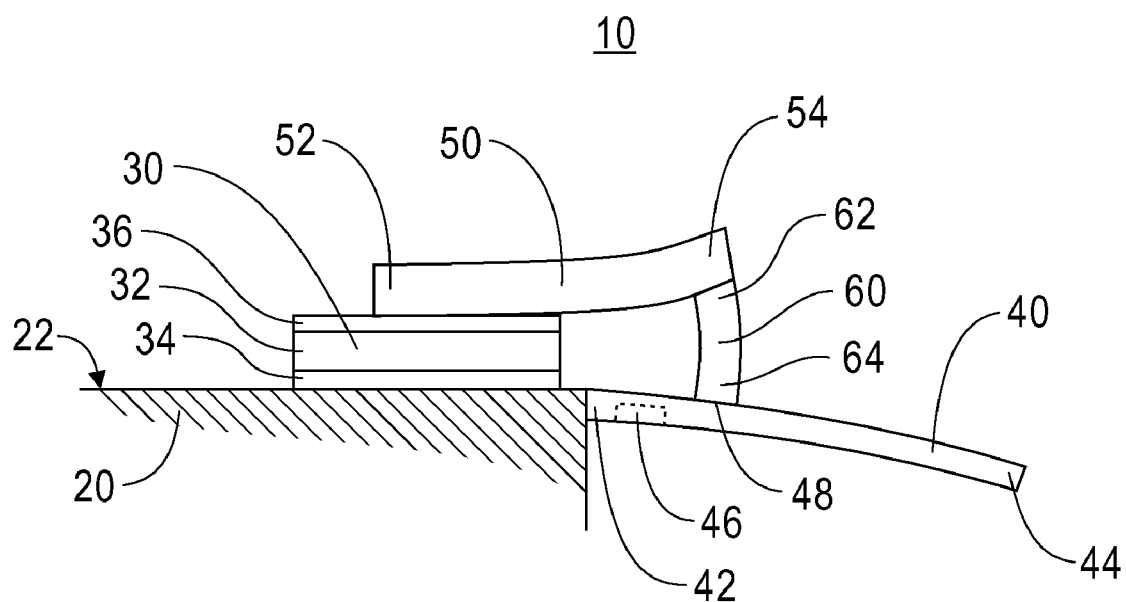
FIG. 2 is a schematic representation of the micro-electro-mechanical device of FIG. 1 in a distorted state.
Figure 6:
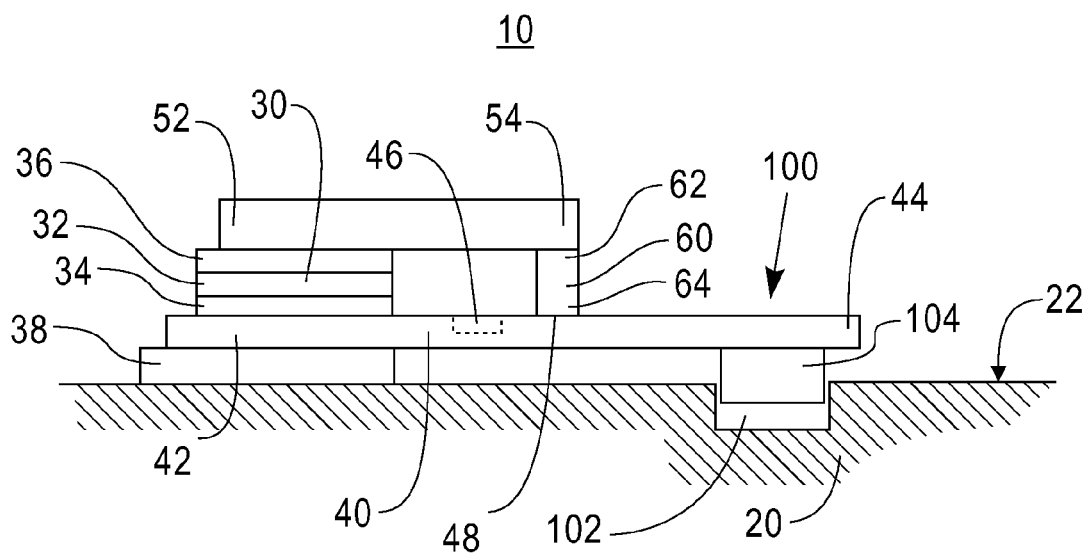
FIG. 6 is a schematic representation of another micro-electro-mechanical device.

FIGS. 2 and 8 display schematic representations of the micro-electro-mechanical devices 10 displayed in FIGS. 1 and 7, respectively, in distorted states. Apart from FIGS. 2 and 8, the micro-electro-mechanical devices 10 displayed in the FIGS. 1 through 9 differ from each other in one or several features. Throughout the FIGS. 1 through 9, similar or corresponding features are identified by the same reference numerals, although these similar or corresponding features may differ from each other in their particular dimensions, materials or other details.

In each of the micro-electro-mechanical devices 10 schematically represented in the FIGS. 1 through 9, the substrate 20 includes silicon, any other semiconductor, sapphire, glass, ceramics or other materials and may include a number of layers, each layer including a different material or several layers including the same material. The main surface 22 of the substrate 20 is the surface to which a piezoelectric actuator 30 is bonded directly or via an auxiliary member. In case of an essentially flat substrate 20, the main surface 22 of the substrate 20 is one of two surfaces extending essentially parallel to the largest dimensions of the substrate 20. When the substrate 20 includes a number of layers, the main surface 22 of the substrate 20 is usually essentially parallel to these layers. In many technologies of fabricating micro-electro-mechanical devices, lithography masks are arranged parallel to the main surface, the direction of projection of the masks on the substrate 20 is essentially perpendicular to the main surface 22, and ions are radiated to the substrate 20 essentially perpendicular to the main surface 22. The main surface 22 of the substrate 20 may be completely or essentially flat or terraced with step heights typically but not exclusively in the range of nanometers or micrometers up to a few hundred micrometers.

The micro-electro-mechanical devices 10 features displayed in the FIGS. 1 through 9 can be positioned anywhere at the substrate 20, from a position at an edge of the main surface 22 to a center position.

FIG. 1 displays a schematic representation of a micro-electro-mechanical device 10 including a substrate 20 with a main surface 22. A piezoelectric actuator 30 is arranged at the main surface 22 of the substrate 20. The piezoelectric actuator 30 includes a piezoelectric layer 32 between a first electrode 34 and a second electrode 36 coupled to conductors not shown in FIG. 1. The first electrode 34 is arranged at a first side of the piezoelectric actuator 30, and the second electrode 36 is arranged at a second side of the piezoelectric actuator 30. Therefore, the reference numerals 34, 36 also identify the first and second sides of the piezoelectric actuator 30.

An elastic member 40 is arranged at the surface 20. A first end 42 of the elastic member 40 is mechanically coupled to the substrate 20. More particularly, the first end 42 of the elastic member 40 is rigidly mounted, or clamped, or anchored, or otherwise fixed to the substrate 20. A second end 44 of the elastic member 40 is a free end and moves in a direction essentially perpendicular to the main surface 22 of the substrate 20 when the elastic member 40 is elastically distorted.

A notch or groove or recess 46 is optionally located near the first end 42 of the elastic member 40. The notch or groove or recess 46 may extend over the entire width (perpendicular to the cross section displayed in FIG. 1) of the elastic member 40. The notch or groove or recess 46 locally reduces the cross sectional area of the elastic member 40 thereby locally increasing the elasticity of the elastic member 40. The notch or groove or recess 46 defines a kind of hinge near the first end 42 of the elastic member 40.

A bar 50 is mechanically coupled to the piezoelectric actuator 30. A first end 52 of the bar 50 is attached to the second side and the second electrode 36 of the piezoelectric actuator 30. A second end 54 of the bar 50 is mechanically coupled or attached to a stud's 60 first end 62. A second end 64 of the stud 60 is mechanically coupled or attached to a coupling point 48 of the elastic member 40. The coupling point 48 is positioned remote from the first end 42 of the elastic member and remote from a second end of the elastic member 40. While the bar 50 is arranged essentially parallel to the main surface 22 of the substrate 20, the stud 60 is arranged essentially perpendicular to the main surface 22 of the substrate 20. The bar 50 and the stud 60 form a transfer member mechanically coupling the second side and second electrode 36 of the piezoelectric actuator 30 to the elastic member 40.

Operation of the micro-electro-mechanical device 10 described above with reference to FIG. 1 will now be described with reference to FIG. 2. When a voltage is applied to the electrodes 34 and 36 of the piezoelectric actuator 30 the height of the piezoelectric layer 32 changes. The height of the piezoelectric layer 32 and, hence, the height of the entire piezoelectric actuator 30 increases or decreases, depending on the piezoelectric material and the sign of the voltage applied to the electrodes 34, 36 of the piezoelectric actuator 30. As an example, FIG. 1 displays the micro-electro-mechanical device without any voltage applied to the electrodes 34, 36 of the piezoelectric actuator 30, while FIG. 2 displays the micro-electro-mechanical device 10 with a non-zero voltage applied to the electrodes 34, 36 of the piezoelectric actuator 30.

As can be seen from a comparison of FIGS. 1 and 2, the height of the piezoelectric layer 32 of the piezoelectric actuator 30 is reduced due to the voltage applied to the electrodes 34, 36. It is to be noted, however, that the amount of change is somewhat exaggerated in FIG. 2. The second electrode 36 and the bar 50 move towards the main surface 22 of the substrate 20. Due to a low compressibility of the stud 60, the coupling point 48 of the elastic member 40 is pressed downward, the elastic member 40 is bent, and the second end 44 of the elastic member 40 moves downward. Since the bar 50 and the stud 60 are not perfectly stiff, there is some distortion of the bar 50 and the stud 60, too. The distance by which the free second end 44 of the elastic member 40 is shifted depends on the voltage applied to the electrodes 34, 36, on the properties of the piezoelectric layer 32 of the piezoelectric actuator 30, on the properties of the bar 50 and the stud 60, on the distance between the coupling point 48 and the first end 42, the distance between the coupling point 48 and the second end 44 and on the geometric and mechanical properties of the elastic member 40. For some piezoelectric materials of the piezoelectric layer 32 of the piezoelectric actuator 30, application of a voltage with inverse sign will cause a movement of the second end 44 of the elastic member 40 in the opposite direction (upward).

Throughout this text the term "downward" refers to a direction to the substrate 20, and the term "upward" refers to a direction away from the substrate 20. Both terms do not refer to the direction of a gravity field, and both terms do not implicate any particular orientation of the micro-electro-mechanical device in a gravity field.

In a typical micro-electro-mechanical device 10 as described above with reference to FIGS. 1 and 2, the elastic member 40 includes silicon and has a thickness of about 1 μm, a width of about 20 μm and a length of about 30 μm, the bar 50 includes silicon nitride, the stud 60 includes silicon, the piezoelectric layer 32 includes aluminum nitride (AlN) and has a thickness of about 3 μm. With these parameters, the fundamental mechanical resonance frequency is about 4 MHz, which can be, for instance, adequate for high data rate probe storage.

Figure 3:
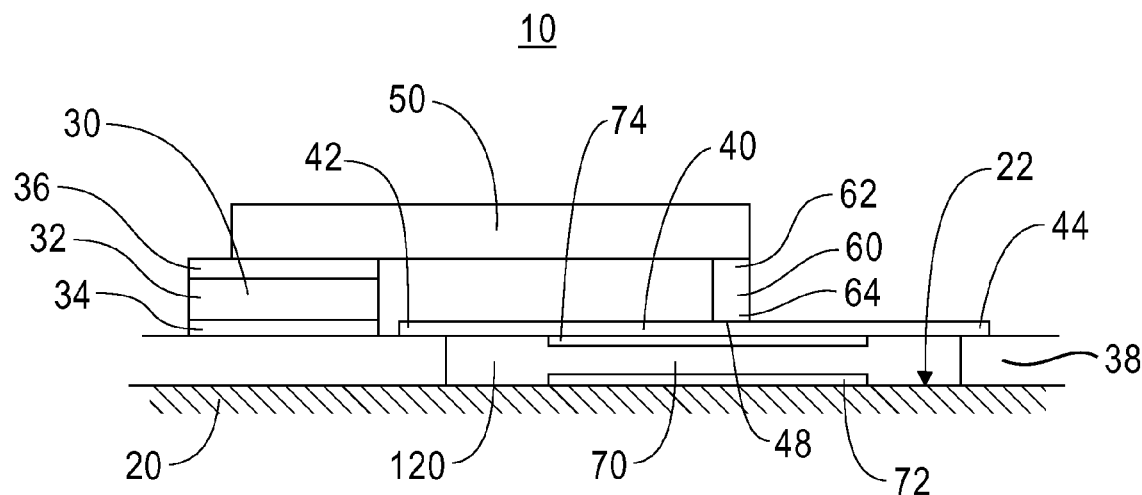
FIG. 3 is a schematic representation of another micro-electro-mechanical device.

FIG. 3 displays a schematic representation of a micro-electro-mechanical device 10 differing from the device described above with reference to FIGS. 1 and 2 in that the elastic member 40 is a membrane rather than a cantilever. At least two opposite edges 42, 44 of the membrane 40 are attached to edges of an auxiliary layer 38. For example, the auxiliary layer 38 is provided with a recess 120 with a rectangular or circular shape, and this recess 120 is covered by the membrane 40.

The piezoelectric actuator 30 can be arranged on the auxiliary layer 38 as shown in FIG. 3. The stud 60 is coupled to a coupling point 48 of the membrane close to the center of the membrane 40. As an example, the micro-electro-mechanical device 10 displayed in FIG. 3 includes a capacitor 70 with variable capacitance. Within the recess 120, a first electrode 72 is arranged at the main surface 22 of the substrate 20, and a second electrode 74 is arranged at the membrane 40. The second electrode 74 can be arranged below the membrane 44 thereby directly facing the first electrode 72 as displayed in FIG. 3. As an alternative, the second electrode 74 can be arranged at the opposite side of the membrane 40 averted from the first electrode 72. In the latter arrangement, the membrane 40 increases the breakthrough voltage between the electrodes 72, 74 of the capacitor 70 and prevents direct contact and electric shorting of the electrodes 72, 74 of the capacitor 70. As a further alternative, the first electrode includes a doped region of the substrate 20 rather than an additional layer as displayed in FIG. 3. As a further alternative the second electrode includes a doped region of the membrane 40 rather than an additional layer at the membrane 40.

Similar to the operation described above with reference to FIG. 2 application of a voltage to the electrodes 34, 36 of the piezoelectric actuator 30 alters the height of the piezoelectric layer 32. This alteration of the height of the piezoelectric layer 32 is transferred to a distortion of the membrane 40 via the bar 50 and the stud 60. An alteration of the distance between the electrodes 72, 74 of the capacitor 70 and a corresponding alteration of the capacitance of the capacitor 70 result.

At the micro-electro-mechanical device 10 described above with reference to FIG. 3 the membrane 40 can be substituted by a beam fixed at both ends rather. In this case, the beam forms the elastic member of the micro-electro-mechanical device. The cross section of the micro-electro-mechanical device with the beam can be rather similar to the cross section displayed in FIG. 3.

The capacitor 70 with variable capacitance controlled by a voltage applied to the electrodes 34, 36 of the piezoelectric actuator 30 described above with reference to FIG. 3 is only one example of an application of the above-described micro-electro-mechanical devices. Instead of an electrode of a capacitor, almost any other operative feature can be mechanically coupled to a cantilever, a membrane, a central region of an elastic bar anchored at both ends or to any other elastic member distorted by a piezoelectric actuator and a transfer member. Examples of further micro-electro-mechanical devices including electric or optic switches or a fluid valve is described below with reference to FIGS. 4 through 6.

Figure 4:
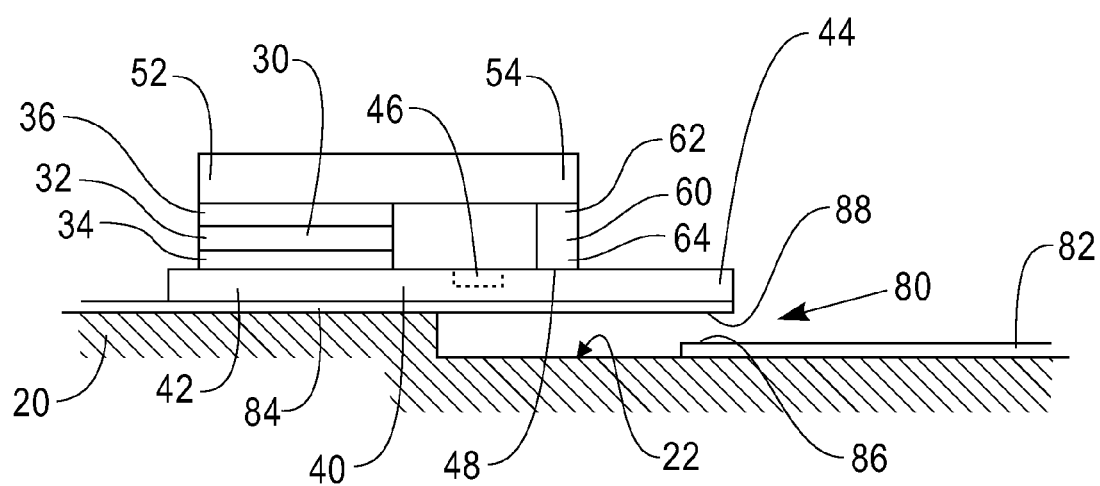
FIG. 4 is a schematic representation of another micro-electro-mechanical device.

FIG. 4 is a schematic representation of a micro-electro-mechanical device 10 including an electric switch 80 controlled by and at least partially integrated with a piezoelectric actuator 30, an elastic member 40 and a transfer member 50, 60 similar to those described above with reference to FIGS. 1 and 2. The micro-electro-mechanical device 10 differs from the device described with reference to FIGS. 1 and 2 in that a first electric conductor 82 is provided at the substrate 20 and a second electric conductor 84 is arranged at the elastic member 40. A first contact 86 and a second contact 88 are formed by opposite areas of the first and second conductors 82, 84 facing each other.

Furthermore, the micro-electro-mechanical device differs from the device described above with reference to FIGS. 1 and 2 in that the piezoelectric actuator 30 is not directly attached to the substrate 10 but to the elastic member's 40 first end 42.

Similar to the example described above with reference to FIGS. 1 and 2, application of a voltage to the electrodes 34, 36 of the piezoelectric actuator 30 causes, via the transfer member 40, 60, a distortion of the elastic member 40. When an appropriate voltage is applied to the electrodes 34, 36 of the piezoelectric actuator 30, the contacts 86, 88 get in mechanical contact, and an electrically conductive path between the first and second conductors 82, 84 of the electric switch 80 is formed.

Figure 5:
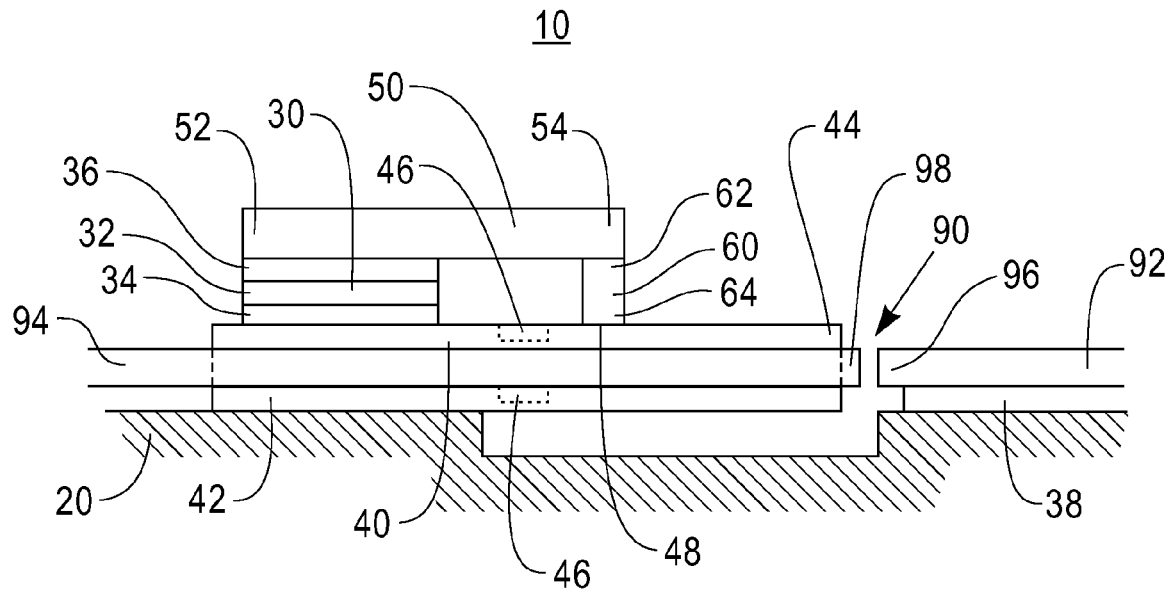
FIG. 5 is a schematic representation of another micro-electro-mechanical device.

FIG. 5 displays a schematic representation of a micro-electro-mechanical device 10 including an optic switch 90 controlled by and at least partially integrated with a piezoelectric actuator 30, an elastic member 40 and a transfer member 50, 60 similar to those of the devices described above with reference to FIGS. 1 through 4. An optic switch 90 includes a first wave guide or light guide 92 attached to the substrate 20 via an auxiliary layer 38 and a second wave guide or light guide 94 attached to the elastic member 40. An end 96 of the first wave guide 92 and an end 98 of the second wave guide 94 facing each other are arranged near the second end 44 of the elastic member 40. The optic coupling between the first and second wave guides 92, 94 via their ends 96, 98 strongly depends on the alignment of the ends 96, 98 of the wave guides 92, 94. The optic coupling between the wave guides 92, 94 is maximized by the perfect alignment displayed in FIG. 5.

Similar to the micro-electro-mechanical devices described above with reference to FIGS. 1 through 4, application of a voltage to the electrodes 34, 36 of the piezoelectric actuator 30 causes a distortion of the elastic member. Thereby, the alignment of the ends 96, 98 of the wave guides 92, 94 is altered. With increasing distance between the ends 96, 98 and with increasing distance between the axes of the wave guides 92, 94 at their ends 96, 98, the optic coupling between the wave guides 92, 94 decreases. Thus, the micro-electro-mechanical device 10 can be operated as an optic switch switching between high coupling and low coupling or as a variable optic attenuator. The state of the switch or the attenuation of the variable optic attenuator, respectively, can be controlled via the voltage applied to the electrodes 34, 36 of the piezoelectric actuator 30.

FIG. 6 displays a schematic representation of a micro-electro-mechanical device 10 including a fluid valve 100 controlled by and at least partially integrated with a piezoelectric actuator 30, an elastic member 40 and a transfer member 50, 60 similar to those of the devices described above with reference FIGS. 1 through 5. A duct 102 is formed in the substrate 20. A valve member 104 is mechanically coupled (more particularly: attached to) the elastic member 40 at or near the second end 44 of the elastic member 40. The shape of the valve member 104 is adapted to the cross section of the duct 102. When the second end 44 of the elastic member 40 is sufficiently bent downward, the valve member 104 closes the duct 102.

Similar to the micro-electro-mechanical devices described above with reference to FIGS. 1 through 5, application of a voltage to the electrodes 34, 36 of the piezoelectric actuator 30 causes the elastic member 40 to bend downward or upward. In the micro-electro-mechanical device 10 displayed in FIG. 6, this vertical movement of the elastic member 40 closes or opens, respectively, the fluid valve 100.

Features of the micro-electro-mechanical devices described above with reference to FIGS. 1 through 6 can be combined to some extent. For example, a terraced main surface 22 of the substrate 20 can be provided instead of an auxiliary layer 38, or an auxiliary layer 38 can be provided instead of or additional to a terraced shape of the main surface 22 of the substrate 20. An electric switch, an optic switch, a variable optic attenuator, a fluid valve or a capacitor with variable capacitance can be formed at or near a free end of a cantilever, a central region of an elastic bar anchored, clamped or fixed at both ends, or a central region of an elastic membrane. Other applications are probe-based technologies such as data storage, nanolithography or nanometrology.

As outlined above, notches or grooves or recesses can be provided in order to form one or several more hinges in the elastic member 40. These optional notches, grooves or recesses 46 are indicated in the FIGS. 1 through 6 by broken lines. The example of FIG. 5 shows that notches, grooves or recesses can be provided at two opposite sides of the elastic member as well. For many applications, it is advantageous to locate the notch, groove or recess between the first (anchored, clamped or fixed) end 42 and the coupling point 48 of the elastic member 40 and close to the first end 42 within the unanchored, or unfixed, region of the elastic member 40.

FIG. 7 displays a micro-electro-mechanical device 10 similar to the devices described above. However, notches, grooves or recesses 46, 56 are provided in both the elastic member 40 and the bar 50 thereby forming hinges in both the elastic member 40 and the bar 50 close to the first end 42 of the elastic member 40 and the first end 52 of the bar 50, respectively. Furthermore, the micro-electro-mechanical device 10 represented in FIG. 7 includes a vertical stud 60 with a large horizontal cross section and a comparatively low elasticity. Operation of the micro-electro-mechanical device 10 is described with respect to FIG. 8.

FIG. 8 displays a schematic representation of the micro-electro-mechanical device 10 described above with reference to FIG. 7 in a state differing from the state displayed in FIG. 7. The states displayed in FIGS. 7 and 8 are caused by different voltages applied to the electrodes 34, 36 of the piezoelectric actuator 30. The particular mechanical properties of the elastic member 40, the bar 50 and the stud 60, the particular dimensions of the notches, grooves or recesses 46, 56 result in a downward motion of the second end 44 of the elastic member 40 when the height, or thickness, of the piezoelectric layer 32 is increased. As can be seen from a comparison with FIGS. 1 and 2, this action is opposite to the action described above with reference to FIGS. 1 and 2.

It is a common feature of the micro-electro-mechanical devices described above with reference to FIGS. 1 through 8 that the piezoelectric actuator 30 is arranged lateral to the elastic member 40 or at least lateral to the unanchored or unfixed region of the elastic member 40 the bending of which is variably controlled by a voltage applied to the electrodes 34, 36 of the piezoelectric actuator 30. Furthermore, it is common to the micro-electro-mechanical devices described above with reference to FIGS. 1 through 8 that the piezoelectric actuator, the transfer member 50, 60 and the elastic member 40 are arranged essentially in one plane (in the planes of the cross sections displayed in the FIGS. 1 through 8). However, there is no need that the direction of transfer of the piezoelectric actuator's action 30 to the elastic member 40 is parallel to the main extension of the elastic member 40. An example is described below with reference to FIG. 9.

FIG. 9 schematically represents a top view of a micro-electro-mechanical device 10 including two piezoelectric actuators 30 each of which is similar to the piezoelectric actuators of the micro-electro-mechanical devices described above with reference to FIGS. 1 through 8. Furthermore, the micro-electro-mechanical device 10 includes an elastic member 40 with a first end 42 attached to an auxiliary layer 38 on a main surface 2 of a substrate 20. The elastic member 40 extends essentially parallel to the main surface 22 of the substrate 20. Apart from the first end 42, the elastic member 40 is arranged over a recess 120 in the auxiliary layer 38.

Therefore, a second end 44 of the elastic member 40 can be moved vertical to the main surface 22 of the substrate 20 due to the elasticity of the elastic member 40.

A bar's 50, ends 52, 54 are attached to those sides of the piezoelectric actuators 30 averted from the substrate 20. A central region of the bar 50 is mechanically coupled to a coupling point 48 of the elastic member 40 via a stud 60. The bar 50 is arranged essentially parallel to the main surface 22 of the substrate 20 and the stud 60 is arranged essentially vertical to the main surface 22 of the substrate 20.

Similar to the micro-electro-mechanical devices described above with reference to FIGS. 1 through 8, the bar 50 and the stud 60 form a transfer member transferring the action of the piezoelectric actuators 30 to the elastic member 40. More particularly, an application of a voltage to electrodes of the piezoelectric actuators 30 causes an alteration of the height of piezoelectric layers of the piezoelectric actuators 30. This alteration is transferred to the elastic member via the bar 50 and the stud 60 and causes a distortion of the elastic member 40 and a corresponding motion of the second end 44 of the elastic member 40 vertical to the main surface 22 of the substrate 20.

In the micro-electro-mechanical device 10 described above with reference to FIG. 9, the direction of transfer from the piezoelectric actuators 30 to the elastic member 40 is essentially parallel to the main surface 22 of the substrate 20 and perpendicular to the direction from the first end 42 to the second end 44 of the elastic member 40. In this configuration, the distance from the bar's 50 ends 52, 54 to the stud 60 is independent of the distance from the first end 42 to the coupling point 48 of the elastic member 40. Therefore, these two distances can be set independent from each other. For example, a large distance from the first end 42 to the coupling point 48 of the elastic member 40 can be set in order to achieve a large elasticity between these two points, while a small distance from each of the ends 52, 54 of the bar 50 to the stud 60 is set in order to achieve a direct and almost lossless transfer of the action of the piezoelectric actuators 30 to the elastic member 40.

Instead of two piezoelectric actuators 30 only one piezoelectric actuator 30 could be provided thereby reducing the required area.

The geometry described with reference to FIG. 9 can be applied to the devices described with reference to FIGS. 1 through 8 as well.

In the micro-electro-mechanical devices described above with reference to FIGS. 1 to 9, the piezoelectric actuator 30 is shown with one piezoelectric layer 32 and two electrodes 34, 36. As an alternative, the piezoelectric actuator 30 can be a piezoelectric stack including a plurality of piezoelectric layers 32 and a corresponding number of electrodes sandwiching each of the piezoelectric layer.

Figure 10:
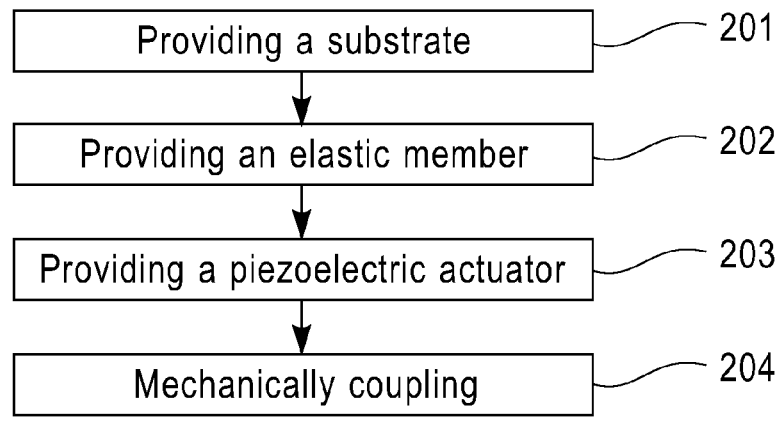
FIG. 10 is a flowchart of a method of fabricating micro-electro-mechanical device.

FIG. 10 displays a schematic flowchart of a method of fabricating a micro-electro-mechanical device. Although this method can be applied to fabricate micro-electro-mechanical devices different from those displayed in FIGS. 1 through 9, reference numerals used in the FIGS. 1 through 9 are used in an exemplary way.

In a fist step 201 a substrate 20 with a main surface 22 is provided. In a second step 202, an elastic member 40 is provided with a first end mechanically coupled to the substrate 20. In a third step 203 a piezoelectric actuator is provided lateral to an unanchored, or unfixed, region of the elastic member 40, wherein a first side of the piezoelectric actuator 30 is mechanically coupled to the substrate 20. In a fourth step 204, a second side of the piezoelectric actuator 30 is mechanically coupled to the elastic member 40 by means of a transfer member 50, 60. The transfer member 50, 60 can be provided after the elastic member 40 and the piezoelectric actuator 30 are provided.

Figure 11:
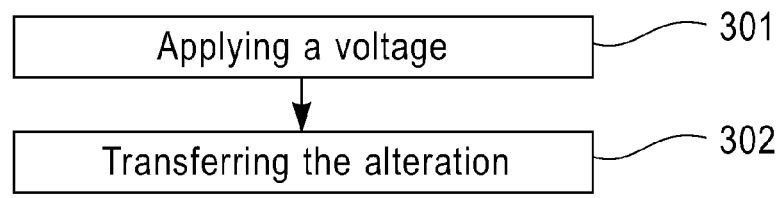
FIG. 11 is a flowchart of a method of transferring piezoelectric action.

FIG. 11 displays a schematic flowchart of a method of translating piezoelectric action vertical to a main surface 22 of a substrate 20 to a member's 40 motion vertical to the main surface 22 of the substrate. Although this method can be applied to devices different from those displayed in FIGS. 1 through 9, reference numerals used in the FIGS. 1 through 9 are used in an exemplary way.

In a first step 301 a voltage is applied to a piezoelectric actuator 30. Thereby, the piezoelectric actuator's dimension vertical to the main surface 22 of the substrate 20 is altered. In a second step 302, the alteration of the vertical dimension of the piezoelectric actuator 30 is mechanically transferred to an elastic member 40, wherein an unfixed region of the elastic member 40 is arranged lateral to the piezoelectric actuator 30. Thereby, the elastic member 40 is distorted in a direction vertical to the main surface 22 of the substrate 20. The alteration of the piezoelectric actuator's vertical dimension 30 can be transferred by means of a transfer member 50, 60 arranged essentially parallel to the main surface 22 of the substrate 20.

What is claimed is:

1. A micro-electro-mechanical device, comprising:
   a substrate with a main surface;
   an elastic member with a first end mechanically coupled to the substrate;
   a piezoelectric actuator with a first side mechanically coupled to the substrate, said piezoelectric actuator being positioned lateral to an unfixed region of the elastic member; and
   a transfer member mechanically coupling a second side of the piezoelectric actuator to the elastic member, wherein the elastic member is elastic in a direction vertical to the main surface of the substrate, wherein the first side of the elastic member is averted from the substrate, wherein the elastic member is a cantilever, wherein the elastic member comprises at least one of a notch, a groove, and a recess, wherein the transfer member is mechanically coupled to a first side of the elastic member, wherein the transfer member is coupled to a coupling point of the elastic member, and wherein the coupling point is remote from the first end of the elastic member.

2. The micro-electro-mechanical device according to claim 1, wherein said at least one of a notch, a groove, and a recess is between points of attachment of (i) elastic member and the substrate and (ii) elastic member and the transfer member.

3. The micro-electro-mechanical device according to claim 1, wherein a capacitor electrode of a capacitor is mechanically coupled to the elastic member.

4. The micro-electro-mechanical device according to claim 3, wherein the micro-electro-mechanical device comprises an electric switch, wherein a contact of the electric switch is mechanically coupled to the elastic member.

5. The micro-electro-mechanical device according to claim 4, wherein the micro-electro-mechanical device comprises a fluid valve with a valve member mechanically coupled to the elastic member.

6. The micro-electro-mechanical device according to claim 5, wherein:
   the micro-electro-mechanical device comprises an optic switch or variable optic attenuator with two wave guides; and
   an end of one of the wave guides is mechanically coupled to the elastic member.

7. The micro-electro-mechanical device according to claim 6, wherein the transfer member comprises:

a bar arranged essentially parallel to the main surface of the substrate and a stud arranged essentially vertical to the main surface of the substrate.

8. The micro-electro-mechanical device according to claim 7, wherein a first end of the bar is at the second side of the piezoelectric actuator.

9. The micro-electro-mechanical device according to claim 8, wherein a second end of the bar is at a first end of the stud.

10. The micro-electro-mechanical device according to claim 9, wherein a second end of the stud is at the elastic member.

11. A micro-electro-mechanical device, comprising:
- a substrate with a main surface;
- an elastic member with a first end mechanically coupled to the substrate;
- a piezoelectric actuator with a first side mechanically coupled to the substrate, said piezoelectric actuator being positioned lateral to an unfixed region of the elastic member; and
- a transfer member mechanically coupling a second side of the piezoelectric actuator to the elastic member;
- wherein the elastic member comprises at least one of a notch, a groove, and a recess; and
- wherein said at least one of a notch, a groove, and a recess is between points of attachment of (i) elastic member and the substrate and (ii) elastic member and the transfer member.

12. The micro-electro-mechanical device according to claim 11, wherein a capacitor electrode of a capacitor is mechanically coupled to the elastic member.

13. The micro-electro-mechanical device according to claim 12, wherein the micro-electro-mechanical device comprises an electric switch, wherein a contact of the electric switch is mechanically coupled to the elastic member.

14. The micro-electro-mechanical device according to claim 13, wherein the micro-electro-mechanical device comprises a fluid valve with a valve member mechanically coupled to the elastic member.

15. The micro-electro-mechanical device according to claim 14, wherein:
- the micro-electro-mechanical device comprises an optic switch or variable optic attenuator with two wave guides; and
- an end of one of the wave guides is mechanically coupled the elastic member.

16. The micro-electro-mechanical device according to claim 15, wherein the transfer member comprises:
- a bar arranged essentially parallel to the main surface of the substrate and a stud arranged essentially vertical to the main surface of the substrate.

17. The micro-electro-mechanical device according to claim 16, wherein a first end of the bar is at the second side of the piezoelectric actuator.

18. The micro-electro-mechanical device according to claim 17, wherein a second end of the bar is at a first end of the stud.

19. The micro-electro-mechanical device according to claim 18, wherein a second end of the stud is at the elastic member.

* * * * *